United States Patent
Kanno

[11] Patent Number: 5,873,380
[45] Date of Patent: Feb. 23, 1999

[54] WAFER CLEANING APPARATUS

[75] Inventor: Itaru Kanno, Hyogo, Japan

[73] Assignee: Mitsubishi Denki Kabushiki Kaisha, Tokyo, Japan

[21] Appl. No.: 583,582

[22] Filed: Jan. 5, 1996

Related U.S. Application Data

[63] Continuation of Ser. No. 254,800, Jun. 6, 1994, abandoned.

[30] Foreign Application Priority Data

Mar. 3, 1994 [JP] Japan .................................. 6-033437

[51] Int. Cl.$^6$ ...................................................... B08B 3/02
[52] U.S. Cl. ........................ 134/102.1; 134/902; 134/153
[58] Field of Search ..................................... 134/157, 153, 134/147, 102.1, 902; 239/413, 417.5, 543, 314, 341, 369, 370, 338; 261/79.1, 115, 28, 78.2; 366/165.1

[56] References Cited

U.S. PATENT DOCUMENTS

| Re. 30,285 | 5/1980 | Babington | 261/78.2 |
|---|---|---|---|
| 1,504,851 | 8/1924 | Wren | 239/417.5 |
| 1,584,046 | 5/1926 | Smith | 261/79.1 |
| 1,716,755 | 6/1929 | Bastian | 261/78.2 |
| 1,948,568 | 2/1934 | Faber et al. | 261/78.2 |
| 2,586,480 | 2/1952 | Ras | 239/120 |
| 2,685,146 | 8/1954 | Stevens | 239/417.5 |
| 2,883,167 | 4/1959 | Krantz | 261/78.2 |
| 3,498,028 | 3/1970 | Trouw | 261/78.2 |
| 3,935,041 | 1/1976 | Goffredo et al. | |
| 3,990,462 | 11/1976 | Elftmann et al. | |
| 4,087,862 | 5/1978 | Tsien | 366/165.1 |
| 4,132,567 | 1/1979 | Blackwood | |
| 4,342,326 | 8/1982 | Meier | 239/338 |
| 4,415,275 | 11/1983 | Dietrich | 366/165.1 |
| 4,564,280 | 1/1986 | Fukuda | 134/902 |
| 4,586,825 | 5/1986 | Hayatdavoudi | 366/165.1 |
| 4,682,615 | 7/1987 | Burkman et al. | |
| 4,726,086 | 2/1988 | Wolf et al. | 261/79.1 |
| 4,749,129 | 6/1988 | Hanson | 261/79.1 |
| 4,787,404 | 11/1988 | Klosterman et al. | 134/102.2 |
| 4,799,993 | 1/1989 | Hagan | |
| 4,801,335 | 1/1989 | Burkman | |
| 5,349,978 | 9/1994 | Sago et al. | 134/153 |
| 5,366,562 | 11/1994 | Schwarze et al. | 134/102.2 |
| 5,456,758 | 10/1995 | Menon | |

FOREIGN PATENT DOCUMENTS

| 81681 | 8/1956 | Denmark | 134/102.2 |
|---|---|---|---|
| 53-29674 | 9/1978 | Japan | 134/902 |
| 59-168446 | 9/1984 | Japan | 134/902 |
| 60-36676 | 2/1985 | Japan | 134/902 |
| 63-110639 | 5/1988 | Japan | |
| 2-280330 | 11/1990 | Japan | |
| 3-167826 | 7/1991 | Japan | 134/902 |
| 3-186369 | 8/1991 | Japan | |
| 4-79326 | 3/1992 | Japan | 134/902 |
| 4-139822 | 5/1992 | Japan | 134/902 |
| 4-187275 | 7/1992 | Japan | 134/99.2 |
| 5-283498 | 10/1993 | Japan | 134/902 |

*Primary Examiner*—Frankie L. Stinson
*Attorney, Agent, or Firm*—Lowe, Price, LeBlanc & Becker

[57] ABSTRACT

A cleaning apparatus is provided which removes contaminants sticking onto a wafer without damaging a device. The cleaning apparatus includes liquid supply means 23 for supplying a liquid not reactive to material constituting a wafer 1, and droplet forming means 10 for interrupting the liquid supplied from liquid supply means 23 to form a droplet 21 out of the liquid. The cleaning apparatus further includes spurting means 22 for spurting the droplet 21 toward the surface of wafer 1.

10 Claims, 10 Drawing Sheets

(a)  (b)  (c)

WAFER CLEANING APPARATUS

This application is a continuation of application Ser. No. 08/254,800 filed Jun. 6, 1994, now abandoned.

BACKGROUND OF THE INVENTION

1. Field of the Invention

The present invention relates generally to wafer cleaning apparatus, and particularly to a wafer cleaning apparatus removing contaminant particles sticking onto a wafer.

2. Description of the Background Art

When a film is formed on a wafer with a CVD method or a sputter method, contaminant particles stick onto the surface thereof. Residue of a resist also sometimes sticks onto the surface. High pressure jet spray cleaning, ultrasonic cleaning and ice scrubber cleaning have been proposed for removing such contaminant.

FIG. 15 is a schematic diagram showing the conception of an apparatus implementing a conventional cleaning method referred to as high pressure jet spray cleaning.

The apparatus includes a liquid pressurizer 3, a spray nozzle 4, and a stage 2 supporting and rotating a wafer 1. In this cleaning method, liquid such as pure water compressed by liquid pressurizer 3 is initially spurted continuously at high speed from spray nozzle 4 toward the surface of wafer 1. The spurted liquid collides against the surface of wafer 1, so as to clean the surface, removing contaminant particles sticking thereonto. The whole surface of wafer 1 is cleaned by rotating wafer 1 with rotation of stage 2 and moving spray nozzle 4.

Referring to FIG. 16, the spurted liquid from spray nozzle 4, being in the form of a column 20, collides against the surface of wafer 1.

In this method, a large amount of liquid such as pure water collides against the surface of wafer 1 at high speed, which gives rise to a problem of generating a static charge on the surface of wafer 1, thereby damaging a device thereon. Although it may be considered, for reducing this damage, to reduce resistivity of pure water by mixing a $CO_2$ gas and the like with the pure water, thereby reducing a static charge generated on the surface of wafer 1, it cannot fully prevent the damage. Another problem in this method is that fine foreign matter (a particle) not more than 1 $\mu$m cannot be completely removed.

FIG. 17 is a schematic diagram showing a conventional cleaning method referred to as ultrasonic cleaning. The cleaning apparatus includes a stage 2 rotating a wafer 1, and a nozzle 5 applying high frequency energy of approximately 1.5 MHz to a liquid such as pure water and discharging the same. A wafer is cleaned by horizontally vibrating pure water at a high frequency with nozzle 5, and discharging the same toward wafer 1.

In this method, similarly to the high pressure jet spray cleaning, fine foreign matter (a particle) not more than 1 $\mu$m cannot be completely removed. In addition, when a speed of rotation of stage 2 is raised for enhancing cleaning effect, the difference in cleaning effect on wafer 1 between the peripheral portion and the center thereof results in uneven cleaning of the surface of wafer 1. Still another problem of this method is that a miniaturized pattern of a device formed on the surface of wafer 1 might be destroyed because of a correlation which has been recognized between destruction of a device and cleaning effect. Although a frequency and a power of the applied energy, a speed of rotation of stage 2, and a distance between nozzle 5 and wafer 1 can be listed as parameters for controlling the destruction of a device and the cleaning effect, it is difficult to control these parameters because of their narrow control range.

FIG. 18 is a schematic diagram of an apparatus implementing a conventional cleaning method referred to as ice scrubber cleaning. The cleaning apparatus includes an ice making hopper 6 making ice particles. Ice making hopper 6 is provided with a supply spray 7 supplying ice making hopper 6 with pure water which is a liquid to be frozen. A spray nozzle 8 spurting ice particles toward wafer 1 is provided at the bottom of ice making hopper 6.

Description will now be made on the operation of the apparatus. A liquified gas, such as liquid nitrogen, is supplied to ice making hopper 6. A liquid to be frozen, such as pure water, is finely sprayed into ice hopper 6 by supply spray 7. Ice particles of several to several tens of $\mu$m made within ice making hopper 6 are sprayed from spray nozzle 8 of a gas ejector type toward wafer 1, thereby cleaning the surface of wafer 1. This cleaning method has higher cleaning effect, compared to the high pressure jet spray cleaning and the ultrasonic cleaning described above. However, detergency is limited, since spray nozzle 8 of the gas ejector type is employed, so that a sputing speed of ice particles determining the detergency cannot exceed the acoustic velocity. Moreover, since use of a large amount of liquid nitrogen for forming ice particles requires higher initial cost for an equipment for supplying liquid nitrogen, and also requires higher running cost. Furthermore, though the problem that a device might be destroyed, as described above, can be suppressed by controlling the spurting speed of ice particles, the controllable range of the spurting speed of ice particles is presently limited within 100 to 330 m/sec., considering problems on the apparatus. Because of such a narrow control range, destruction of a device cannot be fully suppressed.

SUMMARY OF THE INVENTION

One object of the present invention is to provide a wafer cleaning apparatus removing contaminant particles sticking onto a wafer.

Another object of the present invention is to provide a wafer cleaning apparatus improved so as to remove fine foreign matter sticking onto a wafer, whose size is not more than 1am.

Still another object of the present invention is to provide a wafer cleaning apparatus improved so as to have a higher spurting speed than the acoustic velocity.

A further object of the present invention is to provide a wafer cleaning apparatus with lower running cost.

A still further object of the present invention is to provide a wafer cleaning apparatus improved so as to remove contaminant particles sticking onto a wafer without damaging a device.

In one aspect of the present invention, a wafer cleaning apparatus removes contaminant particles sticking onto a wafer. The wafer cleaning apparatus includes a liquid supply device supplying a liquid, and a droplet forming device interrupting the liquid flow supplied from the liquid supply means to form a droplet. The apparatus further includes a spurting device spurting the droplet toward the surface of the wafer.

In a preferred manner of the present invention, the apparatus further includes a device for diagonally spraying a gas toward the surface of the wafer.

In a further preferred manner of the present invention, the apparatus further includes a device for controlling a particle size of the droplet, a device for controlling a collision speed of the droplet against the wafer, and a device for controlling a collision angle of the droplet against the wafer.

In another aspect of the present invention, a wafer cleaning apparatus removes contaminant particles sticking onto a wafer. The wafer cleaning apparatus includes a hopper, and a liquid supply device supplying a liquid non-reactive with material constituting the wafer. The hopper is provided with a spray spraying the liquid supplied from the liquid supply device into the hopper to form a droplet of the liquid. The hopper is also provided with a gas supply device pressurizing a gas and supplying the same to the hopper.

In a preferred manner of the present invention, a plurality of the gas supply devices are so provided that the gas flows in a spiral within the hopper.

In still another aspect of the present invention, a wafer cleaning apparatus removes contaminant particles sticking onto a wafer. The cleaning apparatus includes a liquid pressurizer pressuring a liquid, and a gas pressurizer pressurizing a gas. The cleaning apparatus further includes a spray nozzle to which both of the liquid pressurizer and the gas pressurizer are connected, and spraying either of the liquid and the gas. The nozzle is provided with a valve for switching between the liquid and the gas.

In a further aspect of the present invention, a wafer cleaning apparatus removes contaminant particles sticking onto a wafer. The cleaning apparatus includes a spurting device pressurizing a liquid, and continuously spurting the liquid toward the wafer. Between the wafer and the spurting device, an interrupting device is provided for interrupting the liquid flow spurting out of the spurting device before the liquid attains the wafer.

In a preferred manner of the present invention, the interrupting device includes a rotary slit.

In the wafer cleaning apparatus according to the present invention, a droplet is spurted toward the surface of a wafer. Removal of foreign matter on the wafer is affected most by a spurting speed of the droplet. Since the spurting speed of the droplet can easily exceed the acoustic velocity, the removability of contaminant particles can be increased.

Foreign matter is removed at the moment when colliding material, such as a liquid and an ice particle, collides against the foreign matter. In the present invention, since a droplet is employed as colliding material, the number of collisions increases, so that higher efficiency of removing foreign matter can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
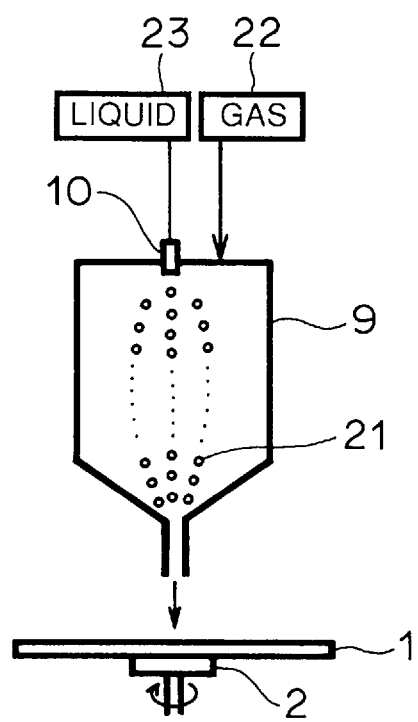
FIG. 1 is a schematic diagram showing the conception of a wafer cleaning apparatus in accordance with Embodiment 1 of the present invention.

FIG. 1 is a schematic diagram showing the conception of a wafer cleaning apparatus in accordance with Embodiment 1. The wafer cleaning apparatus includes a hopper 9 forming a fine droplet 21 and spurting the same. Hopper 9 is provided with a spray 10 spraying finely a liquid within hopper 9. To spray 10 connected is liquid supply means 23 for supplying thereto a liquid non-reactive with material constituting a wafer. Hopper 9 is also connected to gas supply means 22 for pressurizing dry air or a gas, such as nitrogen, and supplying the same to the hopper. The apparatus further includes a stage 2 supporting and rotating a wafer 1. The size of the droplet 21 is determined by the configuration of spray 10 and the supply pressure of the liquid. The spurting speed of the droplet 21 determining the detergency is controlled by the supply pressure of the gas to hopper 9, and the outlet diameter of hopper 9. In the present embodiment, the spurting speed of the droplet 21 can be controlled within the range of 0–330 m/sec by controlling the supply pressure of the gas.

If the surface of wafer 1 against which the droplet 21 collides is covered with the liquid, the detergency is lowered. It is thus preferable to remove swiftly the droplet having collided against wafer 1 by controlling the amount of spurting of the droplet 21 (supply of the liquid) and the rotation speed of stage 2.

Figure 2:
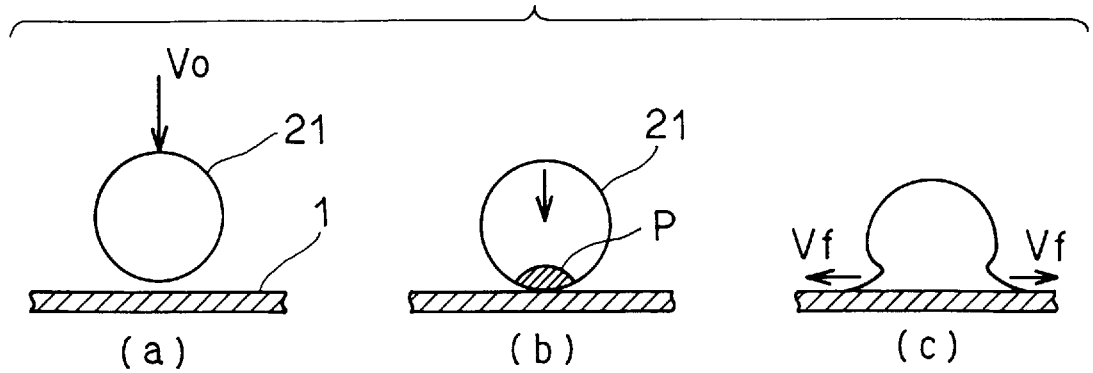
FIG. 2 is a schematic diagram showing the basic conception of the present invention.

Description will now be made on the basic conception of the present invention with reference to FIG. 2.

Referring to FIG. 2(a), the droplet 21 is colliding against wafer 1 at a speed $V_0$. At this time, referring to FIG. 2(b), an impact pressure P is generated at the lower portion of the droplet 21. Then, referring to FIG. 2(c), the impact pressure P brings about a radiation flow in a horizontal direction. The impact pressure P is obtained from the following expression:

The impact pressure $= \frac{1}{2}\alpha\rho_L C_L V_0$ where $V_0$ is a collision speed, $\rho_L$ is a density of the liquid, $C_L$ is an acoustic velocity in the liquid, and $\alpha$ represents a reduction coefficient described in the following equation.

$$\alpha = \frac{0.41}{1 + 5.9\,(\rho_L C_L/\rho_S C_S)}$$

where $C_s$ is an acoustic velocity in the substrate, and $\rho_s$ is a density of the substrate.

A speed of a radiation flow $V_f$ is expressed as follows:

$$V_f = (\alpha C_L V_0)^{1/2}$$

Foreign matter of wafer 1 is removed by force from the radiation flow.

External force (removing force) D exerted on particles on wafer 1 is expressed as follows:

$$D = C_D \frac{\rho_L}{2} V_f^2 \frac{\pi}{4} d^2$$

where $C_D$ is a drag factor. When a Reynolds number R is larger than $10^3$ and the particle is spherical, the drag factor $C_D$ is 0.47. d denotes a size of the particle.

In the above model, the factors determining the removability are the collision speed of the droplet, the density of the liquid, the acoustic velocity in the liquid, and the viscosity of the liquid. Accordingly, in order to increase the removability, the higher density and the higher acoustic velocity are preferable for the liquid.

In the case of pure water, the density and the acoustic velocity can be changed by controlling the temperature thereof. The density of pure water and the acoustic velocity in pure water can be made largest, when the temperature of pure water is controlled to 4° C. by temperature control means.

As modification of the present embodiment, the resistivity of pure water may be lowered by mixing a gas, such as $CO_2$, or a surfactant with pure water in consideration of electrical damage (static charge) applied to a device.

Also, a liquid or a liquid substance including a gel substance may be used, which has a specific gravity, an acoustic velocity, and a viscosity larger than those of pure water.

In order to increase the removability, the collision angle of the droplet 21 may be controlled. The preferable collision angle of the droplet 21 is calculated to be 56° from the surface of a wafer.

Figure 3:
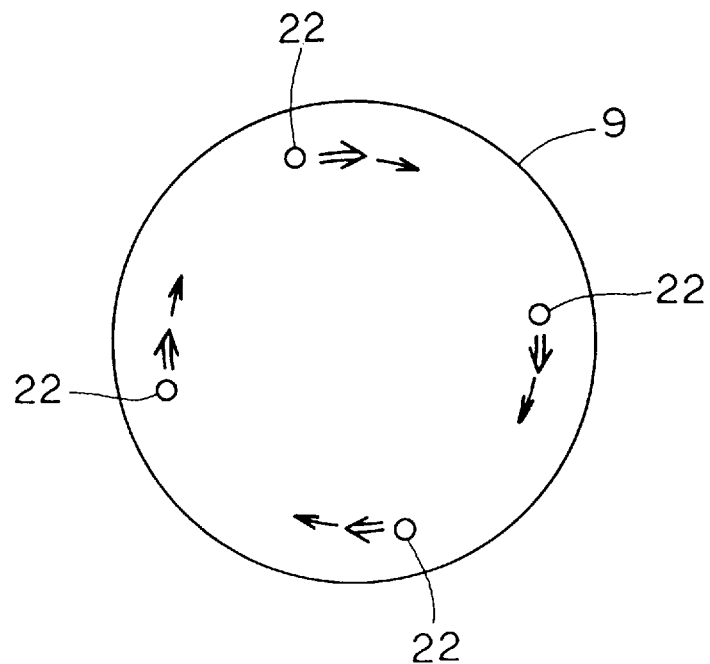
FIG. 3 is a schematic diagram showing modification of the wafer cleaning apparatus in accordance with Embodiment 1.

In the present embodiment, it is preferable to provide a plurality of gas supply means 22 so that a gas flows in a spiral within hopper 9, as shown in FIG. 3. Such configuration prevents droplets from adhering to each other.

Embodiment 2

Figure 4:
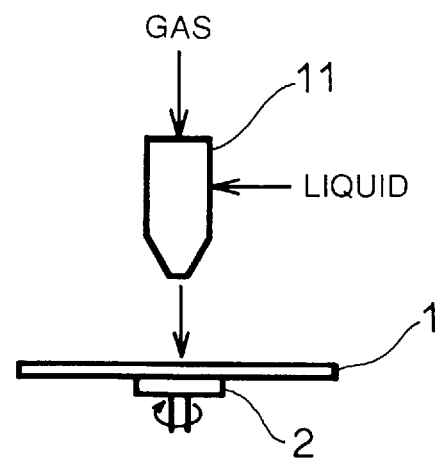
FIG. 4 is a schematic diagram showing the conception of a wafer cleaning apparatus in accordance with Embodiment 2.
Figure 5:
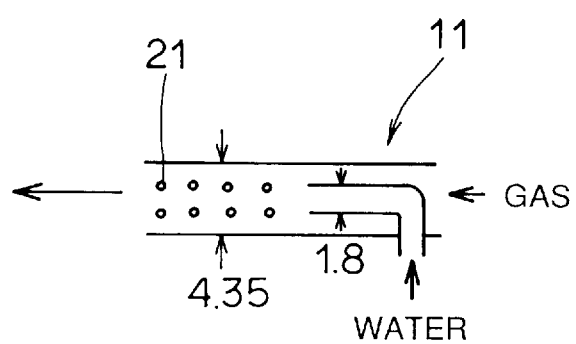
FIG. 5 is a cross section of the ejector nozzle employed in the apparatus shown in FIG. 4.

FIG. 4 is a schematic diagram showing the conception of a wafer cleaning apparatus in accordance with Embodiment 2. The cleaning apparatus includes an ejector nozzle 11. FIG. 5 is a cross section of ejector nozzle 11. Ejector nozzle 11 is provided for forming and spurting a droplet. As shown in FIGS. 4 and 5, with an ejector system employing a pressurized gas, ejector nozzle 1 draws a liquid thereinto, forms a droplet out of the liquid, and spurts the droplet.

The spurting speed of the droplet 21 is controlled with a supply pressure (supplied amount) of the gas. The amount and size of the spurting droplet 21 are controlled with a supply pressure (supplied amount) of the liquid.

Description will now be made on the present invention, applying specific values. Referring to FIG. 5, the supply pressure of pure water is determined to be 7 kg/cm², and the flow rate of pure water to be 2l/min. The inner diameter of a pipe 11 is 1.8 mm. The supply pressure of the gas is determined to be 8.5 kg/cm², and the flow rate of the gas to be 300l /min. The inner diameter of pipe 11 is 4.35 mm. Under such conditions, the spurting speed of the droplet 21 can be made equal to the acoustic velocity (330 m/sec).

Embodiment 3

Figure 6:
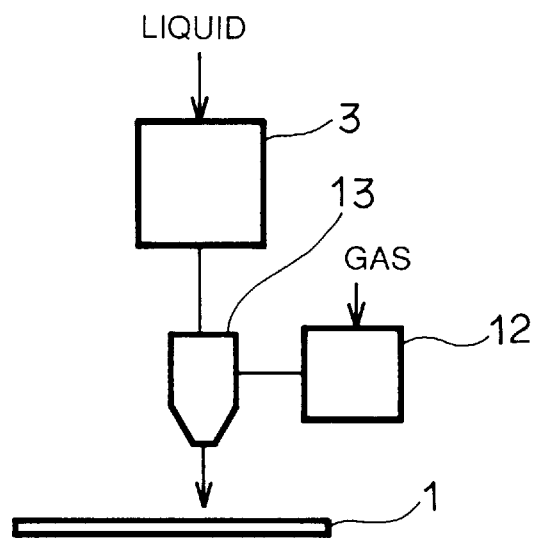
FIG. 6 is a schematic diagram showing the conception of a wafer cleaning apparatus in accordance with Embodiment 3.

FIG. 6 is a schematic diagram showing the conception of a wafer cleaning apparatus in accordance with Embodiment 3. The cleaning apparatus includes a liquid pressurizer 3 pressurizing a liquid, and a gas pressurizer 12 pressurizing a gas. Both of liquid pressurizer 3 and gas pressurizer 12 are connected to a spray nozzle 13 spurting either of the liquid and the gas. Spray nozzle 13 is provided with a valve, not shown, for switching spurting of the liquid and the gas. The size of a droplet, and the space between droplets are controlled with a switched time of the valve for the liquid. The spurting speed of the droplet is controlled with a pressure applied by liquid pressurizer 3. While the liquid does not spurt, the gas spurts from spray nozzle 13 onto wafer 1 to remove the liquid on wafer 1. Since the liquid has been removed from wafer 1 at the moment the droplet collides against wafer 1 again, effective cleaning can be performed.

Figure 7:
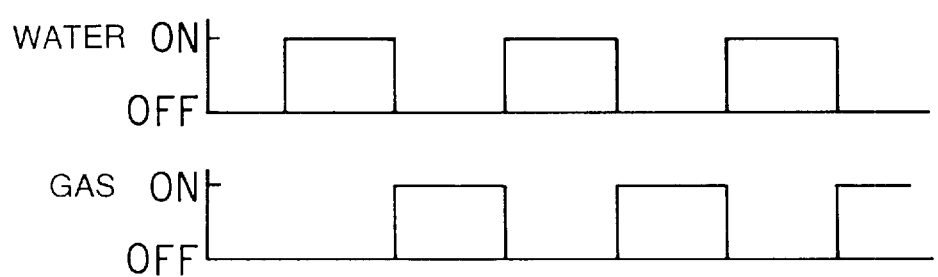
FIG. 7 is a diagram showing switching between a liquid and a gas in the apparatus shown in FIG. 6.

FIG. 7 is a diagram showing on and off of the switching valve for water and a gas. The gas is cut off while water is spurting, and water is cut off while the gas is spurting. The switched time of the value for each of water and the gas is 0.1 msec to 1 sec.

Embodiment 4

Figure 8:
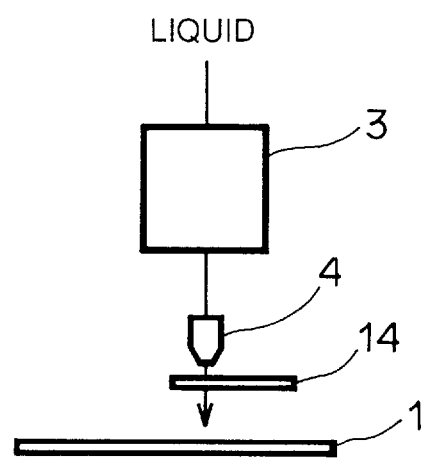
FIG. 8 is a schematic diagram showing the conception of a wafer cleaning apparatus in accordance with Embodiment 4.
Figure 9:
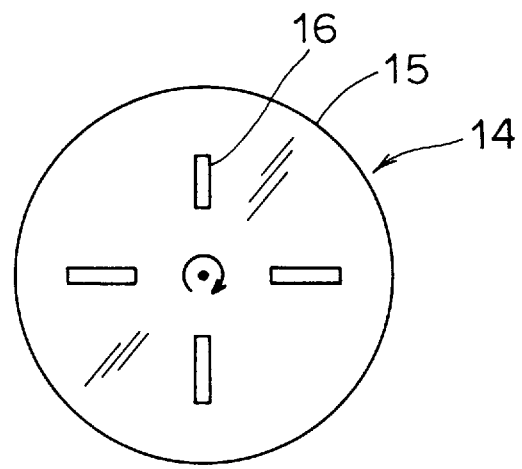
FIG. 9 is a planar view of a rotary slit employed in the apparatus shown in FIG. 8.

FIG. 8 is a schematic diagram of a wafer cleaning apparatus in accordance with Embodiment 4. The cleaning apparatus includes a liquid pressurizer 3 pressurizing a liquid, and spurting means 4 for spurting the liquid toward a wafer 1. Between wafer 1 and spurting means 4 provided is interrupting means 14 for intermittently interrupting a column of the liquid spurted from interrupting means 4. FIG. 9 is a schematic diagram showing one example of the interrupting means. Interrupting means 14 includes a disc 15. Disc 15 is provided with one or more slits 16. Interrupting means 14 rotates as indicated by the arrow in the figure.

The column of the liquid spurted from spray nozzle 4 is interrupted by interrupting means 14 before attaining wafer 1, so as to form a droplet, which collides against wafer 1.

Figure 10:
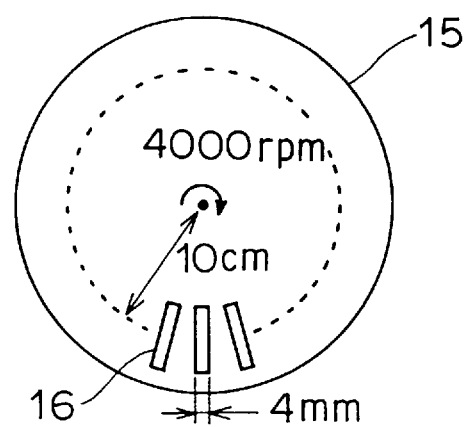
FIG. 10 is a planar view of a specific example of the rotary slit.

The present embodiment will now be described, applying specific values. Referring to FIG. 10, the width of slit 16 is 4 mm. The distance between slit 16 and the center of disc 15 is 10 cm. The rotation speed of disc 15 is 4000 rpm. The diameter of the liquid column is 1 to 2 mm. The spurting speed of the liquid column is 330 m/sec. Under such conditions, a columnar droplet with the length of 3 cm and the diameter of 1 to 2 mm is formed. The number of slits is approximately 50, but is not limited to this.

In this embodiment, it is also preferable to provide a plurality of spray nozzles 4 spurting a liquid column for increasing the number of droplets.

The collision speed of the droplet to wafer 1 is controlled with a pressure applied by liquid pressurizer 3. In this case, the liquid not including a gas is spurted, so that the spurting speed of the liquid can be made higher than the acoustic velocity. Accordingly, the control range of the spurting speed of the droplet, which determines detergency and breakage of the device, is largely extended. The size of a droplet and the space between droplets colliding against wafer 1 are controlled with the rotation speed of disc 15.

Embodiment 5

Figure 11:
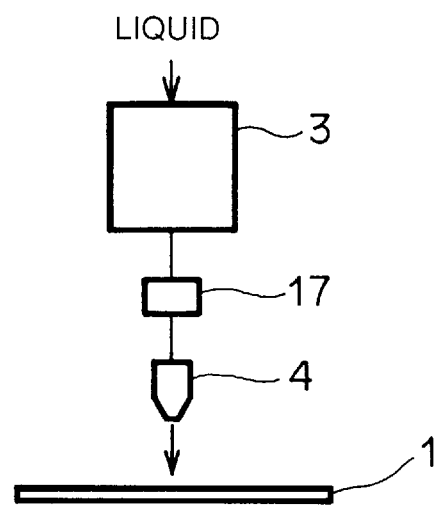
FIG. 11 is a schematic diagram showing the conception of a wafer cleaning apparatus in accordance with Embodiment 5.

FIG. 11 is a schematic diagram showing the conception of a wafer cleaning apparatus in accordance with Embodiment 5. The cleaning apparatus includes a liquid pressurizer 3 and a spray nozzle 4. Between liquid pressurizer 3 and spray nozzle 4 provided is a valve 17 intermittently interrupting a liquid to form a droplet out of the liquid. The size of a droplet and the space between droplets colliding against a wafer 1 are controlled with a switched time of valve 17. Since the liquid not including a gas is spurted, the spurting speed of the liquid can be made higher than the acoustic velocity.

Embodiment 6

Figure 12:
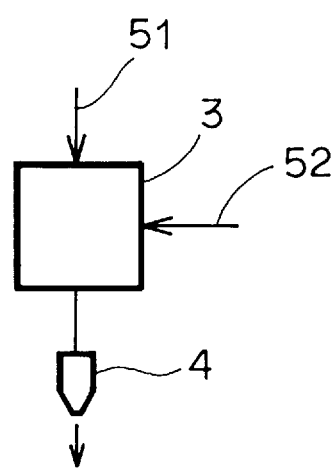
FIG. 12 is a schematic diagram showing the conception of a wafer cleaning apparatus in accordance with Embodiment 6.

FIG. 12 is a schematic diagram showing the conception of a wafer cleaning apparatus in accordance with Embodiment 6. The cleaning apparatus includes a liquid pressurizer 3 and a spray nozzle 4. Liquid supply means 51 for supplying a liquid to liquid pressurizer 3 is connected to liquid pressurizer 3. Foaming gas supply means 52 for supplying a foaming gas to liquid pressurizer 3 is also connected to liquid pressurizer 3. Preferably, the foaming gas is $CO_2$, $N_2$, $O_2$ or the like. In the present embodiment, a liquid into which the foaming gas is dissolved is spurted from spray nozzle 4. Returning at atmospheric pressure, the foaming gas dissolved into the liquid foams, so that the liquid is separated to form a droplet. The droplet collides against the surface of a wafer 1. Since the liquid into which the gas is dissolved is spurted, the spurting speed of the liquid can be made higher than the acoustic velocity, as in Embodiment 5.

Embodiment 7

Figure 13:
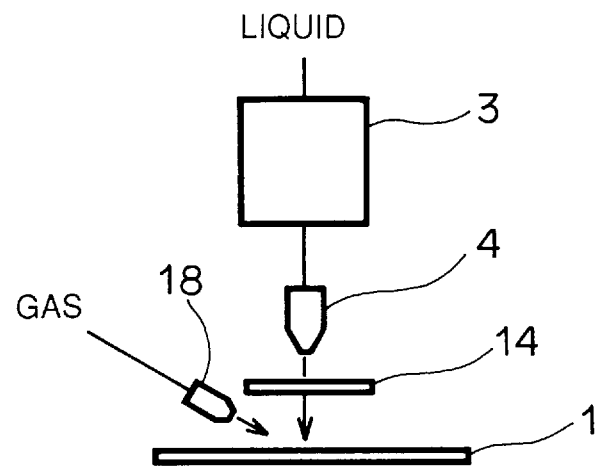
FIG. 13 is a schematic diagram showing the conception of a wafer cleaning apparatus in accordance with Embodiment 7.

FIG. 13 is a schematic diagram showing the conception of a wafer cleaning apparatus in accordance with Embodiment 7. The cleaning apparatus includes a liquid pressurizer 3, a spray nozzle 4 and interrupting means 14. Interrupting means 14 is a rotary slit shown in FIG. 9, for example. The cleaning apparatus further includes a gas spray nozzle 18 spraying a gas diagonally toward the surface of a wafer 1. The cleaning effect (detergency) is not lowered because gas spray nozzle 18 removes swiftly a droplet having collided against wafer 1 from the surface of wafer 1. More specifically, gas spray nozzle 18 removes a film formed of water on wafer 1 which serves as a cushion reducing the impact pressure P in FIG. 2.

In the method shown in Embodiment 1 where wafer 1 is rotated, the difference in detergency between the peripheral portion and the center of wafer 1 causes unevenness of cleaning. To the contrary, in the present embodiment, such a problem is solved, enabling even cleaning.

Embodiment 8

Figure 14:
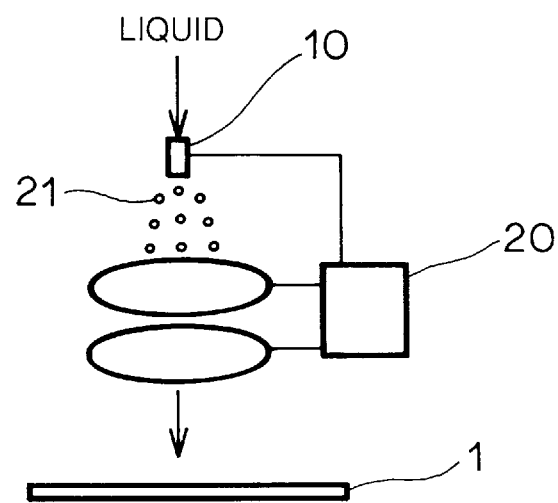
FIG. 14 is a schematic diagram showing the conception of a wafer cleaning apparatus in accordance with Embodiment 8.
Figure 15:
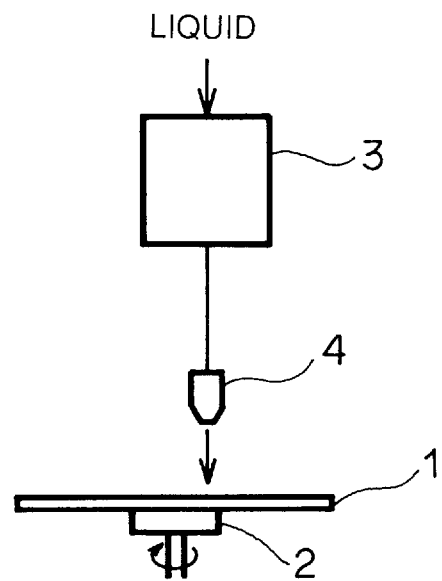
FIG. 15 is a schematic diagram showing the conception of a conventional wafer cleaning apparatus.
Figure 16:
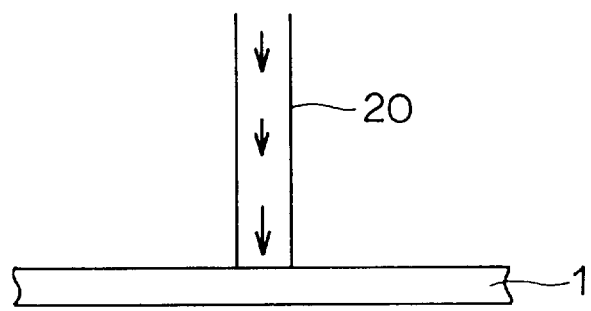
FIG. 16 is a schematic diagram showing the conception of cleaning with the conventional apparatus.
Figure 17:
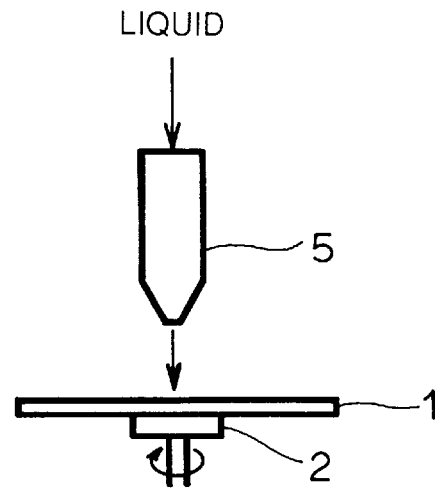
FIG. 17 is a schematic diagram showing the conception of another conventional wafer cleaning apparatus.
Figure 18:
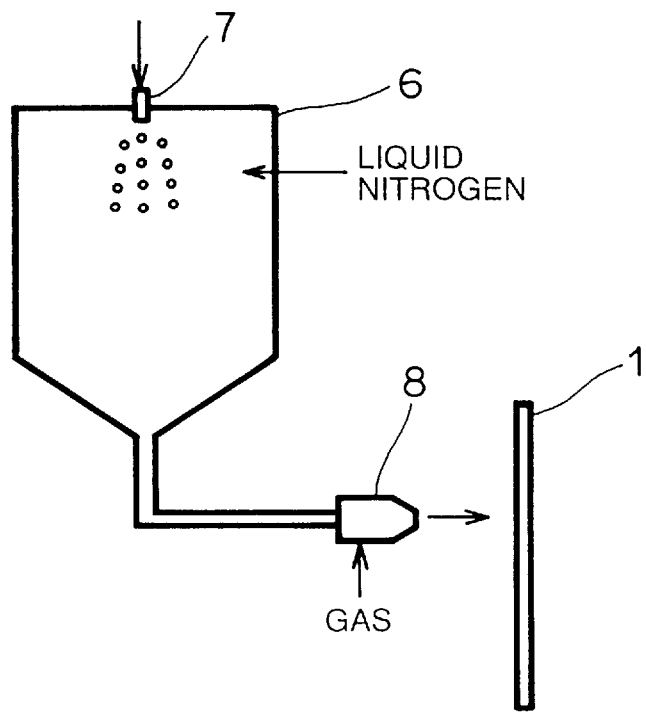
FIG. 18 is a schematic diagram showing the conception of still another conventional wafer cleaning apparatus.

FIG. 14 is a schematic diagram showing the conception of a wafer cleaning apparatus in accordance with Embodiment 8. The cleaning apparatus includes a spray 10. The cleaning apparatus further includes an accelerator 20 charging a droplet 21 sprayed finely by spray 10 to accelerate the same. Spray 10 is supplied with either positive or negative charges. The charged droplet 21 is accelerated by accelerator 20 to collide against a wafer 1. The collision speed of the droplet 21 is controlled with the voltage applied by accelerator 20.

Although this method can be carried out in the atmosphere, it is preferably carried out under reduced pressure in order to increase the speed of the droplet 21. According to the present embodiment, the speed of the droplet is made higher than the acoustic velocity, and in turn, the detergency is increased.

In the wafer cleaning apparatus according to the present invention, a droplet is spurted toward the surface of a wafer. The spurting speed of the droplet can easily exceed the acoustic velocity, increasing detergency for contaminant particles. Moreover, a device is not damaged because a droplet, not an ice particle, collides against a wafer. In addition, the running cost is decreased since liquid nitrogen is not employed in this apparatus.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wafer cleaning apparatus removing contaminant particles sticking onto a wafer by making a liquid particle collide with the surface of the wafer, comprising:

a hopper;

a spray attached to said hopper, for spraying liquid into the hopper in order to form a liquid particle; and plural gas supply means attached to said hopper, for pressuring and supplying a gas to the hopper in order to make said liquid particle collide with a surface of said wafer, wherein the outlet diameter of said hopper and the supply pressure of said gas are chosen such that the spurting speed of the liquid particle is equal to the acoustic velocity.

2. The apparatus according to claim 1, further includes means for rotating said wafer 1.

3. The apparatus according to claim 1, wherein said liquid includes pure water.

4. The apparatus according to claim 3, further includes means for controlling said pure water to 4° C.

5. The apparatus according to claim 1, wherein said liquid includes pure water with $CO_2$ mixed therewith.

6. The apparatus according to claim 1, wherein said liquid includes pure water with a surfactant mixed therewith.

7. The apparatus according to claim 1, wherein
   said liquid includes a liquid with a larger specific gravity, a higher acoustic speed and a larger viscosity than those of pure water.

8. The apparatus according to claim 1, wherein said plural gas supply means are arranged such that a gas flows in a spiral within said hopper.

9. A wafer cleaning apparatus removing contaminant particles sticking onto a wafer by making a liquid particle collide with the surface of the wafer, comprising:

a first pipe with an outlet formed at its one side, in which a pressurized gas flows; and a second pipe having an end portion which penetrates through the side wall of said first pipe into the first pipe, said end portion of the second pipe extending toward said outlet of said first pipe, in which liquid flows; wherein the diameter of said first and second pipes are chosen such that the spurting speed of the liquid particle is equal to the acoustic velocity.

10. A wafer cleaning apparatus removing contaminant particles sticking onto a wafer, comprising:

liquid supply means for supplying a liquid;

droplet forming means for interrupting the liquid supplied from said liquid supply means to form a droplet out of the liquid; and spurting means for spurting said droplet toward a surface of said wafer, means for controlling a particle size of said liquid particle, means for controlling a collision speed of said liquid particle against said wafer, and means for controlling a collision angle of said liquid particle against said wafer.

\* \* \* \* \*